United States Patent [19]

Chasek

[11] 4,339,828
[45] Jul. 13, 1982

[54] AUTOMATIC METHOD FOR ADVANTAGEOUSLY TRADING SIGNAL DISTORTION FOR IMPROVED NOISE THRESHOLD IN FREQUENCY MODULATED RECEIVERS

[76] Inventor: Norman E. Chasek, 24 Briar Brae Rd., Stamford, Conn. 06903

[21] Appl. No.: 84,182

[22] Filed: Oct. 12, 1979

[51] Int. Cl.³ .............................................. H04B 1/16
[52] U.S. Cl. .................................... 455/205; 455/266
[58] Field of Search .............. 455/205, 208, 211, 212, 455/266; 329/122, 126

[56] References Cited

U.S. PATENT DOCUMENTS 2,969,459  1/1961  Hern ................................... 455/266
3,657,661  4/1972  Jarger ................................. 455/208

*Primary Examiner*—Jin F. Ng
*Attorney, Agent, or Firm*—Parmelee, Johnson, Bollinger & Bramblett

[57] ABSTRACT

Communications systems employing frequency modulation have noise threshold levels that practically limit the minimum received signal level. This limit is particularly significant to satellite earth stations. A method that automatically and advantageously trades improved threshold levels for increased distortion by reducing the noise bandwidth of the receiver as the carrier to noise ratio approaches the threshold level is described. This method senses when noise peaks approach, equal or exceed the FM carrier level, converts the rate at which these noise peak events occur into a control voltage whose average magnitude controls the bandwidth of a filter inversely to the noise peak event rate. When this method is applied to FM receivers with threshold extending FM feedback loops, the control voltage also increases the loop feedback factor thereby reducing distortion and better optimizing the distortion-threshold trade-off. Illustrative designs for a voltage controlled filter, a noise peak event indicator and controller are described.

12 Claims, 6 Drawing Figures

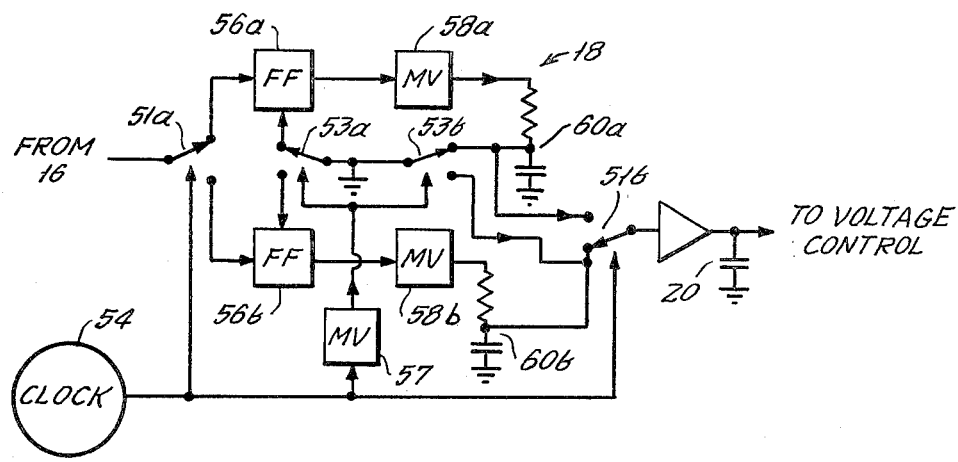
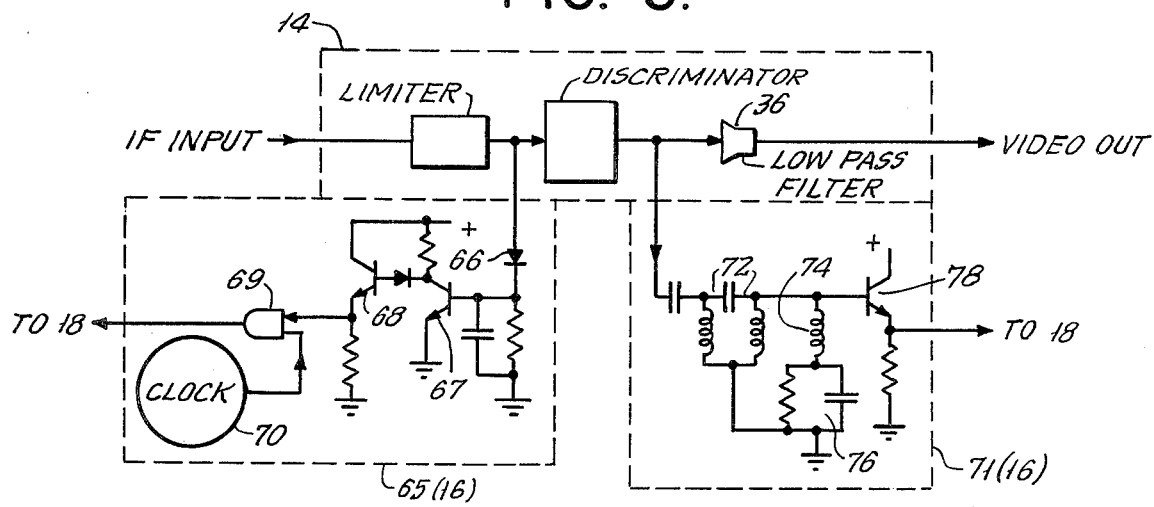
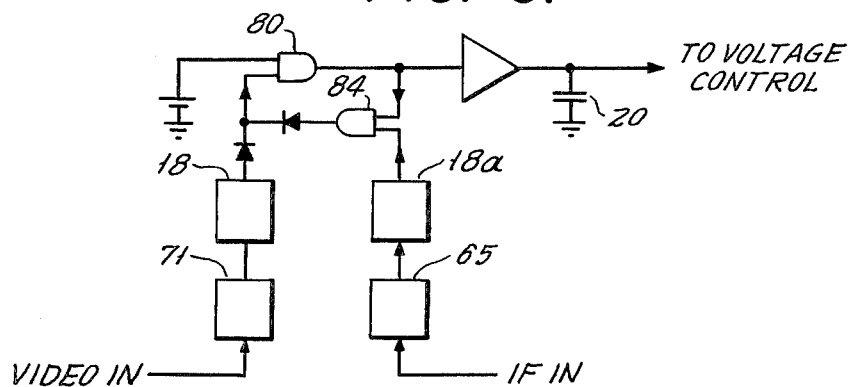

AUTOMATIC METHOD FOR ADVANTAGEOUSLY TRADING SIGNAL DISTORTION FOR IMPROVED NOISE THRESHOLD IN FREQUENCY MODULATED RECEIVERS

BACKGROUND OF THE INVENTION

Frequency modulation systems exchange bandwidth for improved noise performance. However as increased receiver noise, due to the wider band IF amplifiers exceeds the FM carrier, rapidly increasing noise impulses are generated. Restricting the noise bandwidth, prior to limiting, reduce the threshold level at which the noise impulses are generated but this increases signal distortions. Normally an FM receiver's bandwidth, prior to limiting, is fixed, usually designed to optimally satisfy signal distortion consistent with the lowest noise threshold level. As carrier to noise ratios (C/N) fall to threshold, due to received signal fades or equipment deterioration, the output signal to noise falls even more rapidly and there is advantage to adjusting the design trade-off between distortion and noise.

Wideband satellite earth stations, which employ wide deviation FM and threshold extension feedback loops, cannot fully exploit the full threshold extension theoretically possible because of excess delay in the feedback loops which causes oscillation. However, as the noise bandwidth defining filter is narrowed, the excess delay becomes less significant and the feedback factor can be increased. As the feedback factor is increased, the distortion created by restricting noise bandwidth filters is reduced. The feedback factor can theoretically be increased to the point where loop oscillations are triggered. These oscillations normally occur above the video band. A method that can extend the noise threshold of FM receivers to obtain increased fade margin will be useful in improving the practicality of many radio transmission systems and particularly satellite earth stations.

SUMMARY OF THE INVENTION

A method that automatically trades off signal distortion for an improved noise threshold level is described by this invention. The number of time units, per fixed interval of time, in which noise peaks approach, equal or exceed the peak FM carrier level, is sensed and converted to a voltage in an event rate averaging circuit. This process is followed by a longer time averaging circuit which controls the receiver's noise bandwidth, prior to limiting, so that as the number of noise peak events increases, the filter bandwidth is reduced. The actual control of the filter bandwidth can be accomplished by either switching or continuous feedback methods. When the method described by this invention is applied to threshold extending feedback loops, the time averaged voltage that reduces the filter bandwidth can also increase the loop feedback factor simultaneously, thereby reducing the distortion created by any excessively narrowed noise bandwidth filter. A means of stabilizing loop oscillations that might be incurred by the increased feedback factor is realized by detecting the oscillations in the band above the information band, where these oscillations typically occur, and then using their detected voltage to reduce the feedback factor.

A voltage controlled variable bandwidth filter is achieved by using PIN diodes as non-linear resistors, which change the filter's Q without detuning the filter. The detection of noise peaks that approach, equal or exceed the FM carrier is accomplished by detecting instantaneous carrier plus noise levels that are in the vicinity of zero amplitude or by detecting the noise impulses created, after demodulation, as noise peaks exceed the FM carrier level. The noise peak events are converted to a voltage that is proportional to the number of such noise peak events occurring per unit time. The illustrative method for accomplishing this conversion marks each $n^{th}$ noise peak event with a pulse of constant shape and amplitude. These pulses are subsequently integrated. By switching alternatively between two event converters, and giving each converter time to ascertain the number of events in its measurement interval, a voltage that is proportional to the number of noise events occurring during that measurement interval is generated.

In order to prevent loop instability or hunting, it is necessary to smooth the noise event converter's output with a time averaging device that has a far greater time constant than that of the event converter.

The various aspects and advantages of this invention will be more fully understood from a consideration of the following detailed description in conjunction with the accompanying drawings.

BRIEF DESCRIPTION OF THE DRAWINGS

FIG. 4 is an illustrative method for converting the rate at which noise peaks approach, equal or exceed the FM carrier into a voltage magnitude.

FIG. 5 illustrates two circuits for detecting each noise peak that approaches, equals or exceeds the FM carrier.

FIG. 6 is a block diagram of an automatically switched, bandwidth control implementation of the invention.

DETAILED DESCRIPTION OF THE INVENTION

Figure 1:
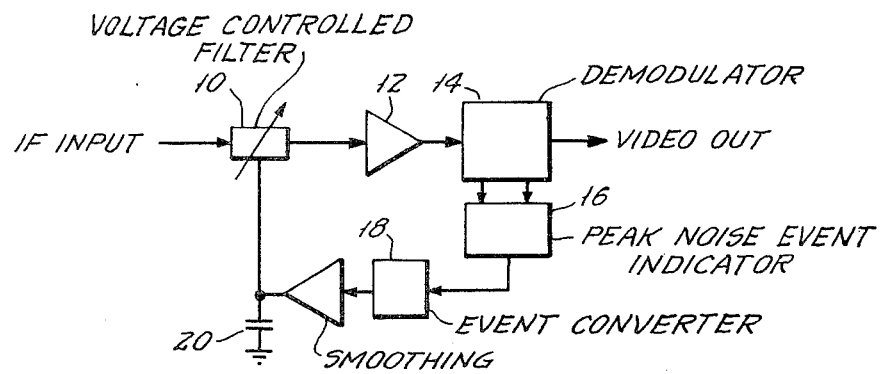
FIG. 1 is a block drawing that summarizes the essential ingredients of the invention.

FIG. 1 is a functional block diagram describing a preferred method for automatically exchanging signal distortion for a lowered noise threshold level in FM receivers. Illustrated in FIG. 1 are filter 10, which controls both the receiver's noise bandwidth and signal distortion, its bandwidth being voltage controlled; amplifier 12, an optional IF amplifier stage; FM demodulator 14, including limiter and discriminator; noise peak event monitor 16, which determines unit times that noise peaks approach, equal or exceed the FM carrier level; event converter, 13, which converts the number of unit times per given interval of time that these noise peak events occur and converts that rate into a voltage amplitude; voltage integrator, 20, which time averages that voltage amplitude over intervals that are long compared to typical signal cycles. Filter 10, with no externally applied voltage, is optimally shaped for best overall transmission and threshold performance. As a voltage is applied to it, that increases as the rate of noise peaks approaching, equaling or exceeding the FM carrier increases, the bandwidth of filter 10 narrows keeping its center frequency fixed. This filter bandwidth control can be continuous, as in analogue type feedback loops, or it can be switch controlled as specified upper threshold event counts are exceeded and switched back again to the wider bandwidth, when the event count falls below a lower level, the difference between the two levels being greater than the change in the event count as the filter bandwidth is switched for a constant noise condition.

Figure 2:
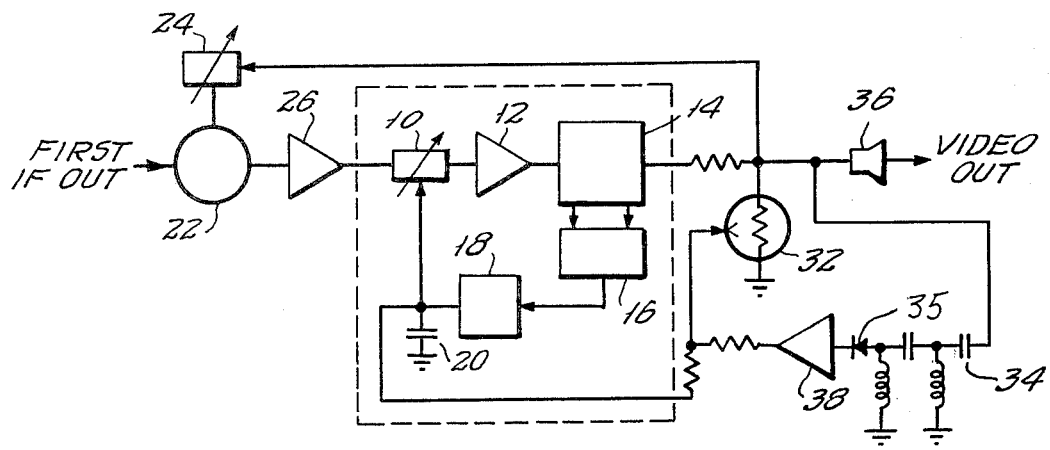
FIG. 2 is a block drawing illustrating the application of the invention to an FM receiver with a threshold extending FM feedback loop.

FIG. 2 is a block diagram that illustrates the peak noise event feedback applied to a threshold extending (TE) feedback loop. The feedback factor of the TE loop is controlled to some extent by the same voltage that controls the filter bandwidth. Referring to FIG. 2, which functionally represents a threshold extending circuit, mixer 22 converts a received signal to a second IF. Local oscillator 24 whose frequency is voltage controlled, receives a portion of the demodulated signal, which is fed back to control its instantaneous frequency, acting to reduce the frequency deviation of the FM signal appearing at the output of mixer 22. IF amplifiers 26 and 12 bracket voltage bandwidth controlled filter 10. FM demodulator, 14, noise peak event-converter 18, and integrator 20 complete the circuit.

Some of the feedback voltage fed into filter 10 is fed into voltage controlled opto-resistor 32 which adjusts the feedback factor of the TE loop so that a narrowing of filter 10 also increases the feedback factor of the TE loop. This acts to counter increased distortion created by narrowing filter 10. Some increase in feedback is possible without creating loop oscillation because residual loop delays, that cause oscillation as the feedback factor is increased, are less significant as filter 10 has its bandwidth reduced. If an oscillation is induced by this feedback increase, it can be detected through high pass filter, 34, which precedes low pass filter 36 and by detector-amplifier 38 producing a control voltage that counters the voltage being fed back into opto-resistor 32 by event converter 18. The result of this secondary loop will be to stabilize the oscillation level so that it will not cause non-linearities which would interfere with low distortion information transmission. Such loop oscillation typically occurs in the vicinity of the 12 db response point of filter 10, which almost always corresponds to a frequency well above the range used for information transmission. High pass filter, 34, filters out all known coherent signals and detection circuit 35 detects oscillations above a threshold level. After d.c. amplification in amplifier 38, the resulting voltage is of opposite polarity as that applied to opto-resistor 32 from event converter 18. An opto-resistor is a combination of a light emitting diode and light sensitive resistance material in which the resistance varies with light intensity, which is a function of the current applied to the light emitting diode.

Figure 3:
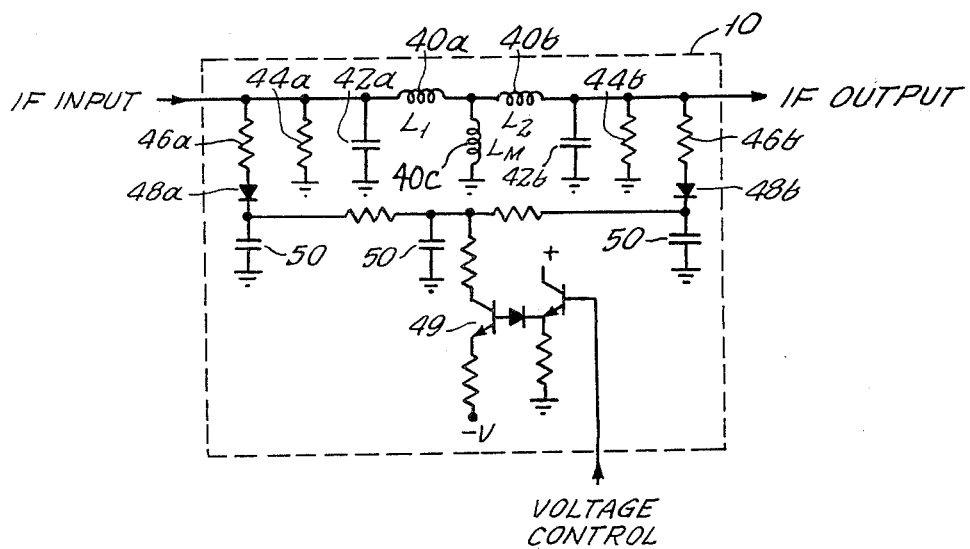
FIG. 3 is an illustrative design for a voltage bandwidth controlled filter.

FIG. 3 illustrates a design for filter 10. Inductors 40a, b and c along with capacitors 42a and b form a double tuned filter. Resistors 44a and b are its source and load resistances. Resistors 46a and b, in series with PIN diodes 48a and b form additional adjustable resistive loading. Capacitors 50 are used for decoupling purposes. When the PIN diodes conduct maximum current, their resistance is minimum. For this condition circuit Q will equal $$\frac{\sqrt{(L_1 + Lm)(L_2 + Lm)}}{Lm}.$$

This mathematical relationship of circuit values produces a bandshape that is optimally flat. As the current in PIN diodes 48a and b is reduced, controlled by amplifier 49, their resistances increase and the bandwidth narrows, the center frequency remaining fixed.

FIG. 4 illustrates an analogue version of an event-to-voltage converter. Switches 51 and 53 are two-pole-double-throw voltage controlled switches, whose state is controlled by clock 54. Flip flop dividers 56a and 56b are used to divide the number of pulses fed out from noise peak event monitor 16. The flip flop reduces the noise count so each time the last flip flop stage transitions in a given direction, it fires either multivibrator 58 or 58a. The multivibrator outputs feed integrator circuits 60a and 60b. Switch 51 is comprised of sections 51a and 51b. As section 51a makes contact with flip flop input terminal 56a, switch section 51b makes contact with the output terminal of multivibrator 58b. Simultaneously switch sections 53a and 53b are momentarily closed by differentiator 57, which clears the stored count in flip flop 58a and removes the accumulated voltage on integrating capacitor 60a. Event-to-voltage converting can also be achieved by all digital means, in which multivibrators 58 and integrators 60 are replaced by digital counters and switch 51 alternately reads their count into a digital to analogue converter, all counts being cleared by switch 53.

Capacitor 20 serves as the long time integrator. Its time constant is much greater than the period of clock 54 to prevent loop hunting or instability. A clock period of 0.01 seconds and a smoothing time constant of 0.1 seconds would be typical design quantities.

FIG. 5 illustrates two methods for detecting noise peak events. The first method detects the time units in which noise peaks combined with the FM carrier produce net voltage levels that approach or equal zero amplitude. If a noise threshold is defined by the number of times per given interval of time that noise induced phase reversals are created, following limiting, then this sensing method serves best for detecting noise that is approaching a threshold level. A second method detects actual phase reversals by detecting their phase discontinuities which causes the well known popping sounds when FM carriers are below threshold. These "pops" or transients are easily detected and their rates can be determined by high pass filters and thresholding counters or integrators. The use of one method or the other, or both methods combined, is an engineering decision based on system trade offs.

FIG. 5 dotted block 65(16) illustrates a preferred circuit design for the former noise event monitor. It consists of detector diode, 66, preferably connected to the limiter output. The detected voltage normally keeps transistor 67 in a near saturated condition. When the composite noise and carrier signal detected by diode 66 falls to near zero, the output voltage of the amplifier increases sharply, creating pulse like signals. These signals are sampled by gate 69 and clock 70, whose clock frequency approximately equals the receiver's noise bandwidth. The output pulse count will indicate the number of time units in which the noise approaches the peak carrier amplitude.

FIG. 5 dotted block 71(16) illustrates a preferred circuit design for the latter noise event monitor. It consists of high pass filter 72 connected in before low pass filter 36. Filter 72 eliminates most signal content. Thresholding diode 73 allows peak signals whose magnitude exceed its knee voltage to pass into the following differentiating circuit. Inductor 74 acts as the differentiator which acts to better separate out noise transients from normal high frequency accented FM noise. Resistor-capacitor 76 acts to adjust the thresholding level to better adapt to input signal level variations.

Although continuous feedback control appears to be a desireable method for trading distortion off for noise threshold extension, a switched method can achieve nearly as much benefit but with better insurance against unforeseen loop instability problems. The threshold level would be extended a pre-determined amount when a given threshold condition is exceeded and would then be switched back to its normal state when the threshold condition falls below some lower level. The two switching levels are selected so as to avoid switching instabilities.

FIG. 6 illustrates a method for activating switching between two filter bandwidths and two threshold extending loop gains.

Noise event detector 71 is followed by event-converter 18. When the event rate reaches a thresholding level, gate 80 is opened, applying d.c. voltage to event integrator 20 which activates the switching. Opening gate 80 also opens gate 84 which contributes a second voltage to gate 80 generated by noise event detector 65 and event converter 18a. This switched condition would reduce the receiver's noise bandwidth and the TE feedback gain by specified amounts. Noise event detector 65 will be activated by higher carrier to noise conditions than event detector 71. This switched condition is maintained until C/N levels in both detectors fall below their respective thresholds. This second condition causes gate 84 and gate 80 to close, thereby switching the filter and TE loop again conditions back to their initial normal status. Thresholding levels for detectors 65 and 71 are selected to avoid switching instabilities.

I claim:

1. A method for automatically and continuously trading increased signal distortion for a reduced FM noise threshold level in an FM receiver which receives an FM signal having an FM carrier level which is passed through a limiter, said FM receiver having a noise threshold level, comprising the steps of:
    detecting noise peaks which approach, equal or exceed the FM carrier level of said FM carrier signal,
    determining the rate at which said noise peaks are detected,
    converting the rate at which said noise peaks are detected into a control voltage and
    controlling the FM noise threshold level with said control voltage.

2. An FM receiver system which includes an FM receiver for receiving an FM signal having an FM carrier level which is passed through a limiter, said FM receiver automatically and continuously trading increased signal distortion for a reduced FM receiver noise threshold level comprising:
    detection means for detecting noise peaks which approach, equal or exceed said FM carrier level and the rate at which said noise peaks occur,
    means for converting the rate at which said noise peaks occur into a control voltage whose magnitude is functionally related to the rate of occurrence of said noise peaks,
    means for averaging out fluctuations in said control voltage, and
    a voltage controlled variable bandwidth filter having said control voltage applied thereto for controlling the noise threshold level of said FM receiver by reducing the bandwidth of said filter as the rate of said noise peaks increase and vice versa.

3. A method for automatically and continuously trading increased signal distortion for a reduced FM noise threshold level in an FM receiver of the type having a voltage controlled variable bandwidth filter coupled to an FM demodulator, and a threshold extending feedback loop, said FM receiver having a noise threshold level and receiving an FM signal having an FM carrier level which is applied to the limiter of said FM demodulator comprising the steps of:
    detecting noise peaks from said limiter which approach, equal or exceed the FM carrier level of said FM signal,
    determining the rate in a given interval of time in which said noise peaks are detected,
    generating an averaged control voltage that is functionally related to the rate of occurrence of said noise peaks,
    adjusting the bandwidth of said voltage controlled variable bandwidth filter using said averaged control voltage and
    simultaneously adjusting the feedback in said threshold extending feedback loop using said averaged control voltage.

4. The method as claimed in claim 3 including the additional steps of:
    detecting the voltage magnitude of any induced oscillations in said threshold extending feedback loop and,
    using the detected voltage magnitude to increase the attenuation in said threshold extending feedback loop.

5. An FM receiver system for receiving an FM signal having an FM carrier level, said system automatically trading increased signal distortion for reduced FM noise threshold levels in said FM receiver which also includes a threshold extending feedback loop, comprising:
    detection means for detecting noise peaks which approach, equal or exceed said FM carrier level,
    converter means for determining the rate of occurrence of said noise peaks and converting said rate into a functionally related voltage magnitude,
    means for averaging out fluctuations in said voltage magnitude over a given time period to provide a control signal,
    a voltage controlled variable bandwidth filter in said FM receiver having said control signal applied thereto for controlling the bandwidth of said filter such that as the rate of noise peaks increases or decreases the bandwidth of said filter is reduced or increased accordingly, and
    a voltage controlled attenuator coupled to said threshold extending feedback loop having its attenuation controlled by said control signal.

6. The FM receiver set forth in claim 5 including a high pass filter and a detector-amplifier coupled to said threshold extending feedback loop for detecting oscillations in said threshold extending feedback loop and providing a detected voltage related to said oscillations, a voltage controlled attenuator coupled to said threshold extending feedback loop, and means for applying said detected voltage to said voltage controlled attenuator so as to increase the attenuation of said attenuator as said oscillations increase and to reduce the attenuation of said attenuator as said oscillations decrease.

7. A method for automatically trading increased signal distortion for a reduced FM receiver noise threshold level in an FM receiver, as noise peaks approach, equal or exceed the FM carrier by varying the receiver bandwidth, said FM receiver receiving FM signals having an FM carrier which is applied to a limiter, comprising the steps of:

detecting the noise peaks which approach, equal or exceed the FM carrier, determining the time rate at which said noise peaks occur, sensing when the time rate at which noise peaks occur exceeds a specified upper level and at such times, latch switching to a narrower receiver bandwidth and holding said narrower receiver bandwidth condition until the noise peak time rate falls below a specified lower level, said lower level being specified so that if the wider bandwidth were switched in, for a given noise level, the noise peak time rate would be below said upper specified level, and then switching back to a wider receiver bandwidth when the noise peak time rate falls below said lower specified level.

8. The method claimed in claim 7, when applied to an FM receiver having a threshold extending feedback loop including the step of changing the feedback in said feedback loop as said bandwidth of said FM receiver is switched from a wider to a narrower bandwidth or from a narrower to a wider bandwidth.

9. The method as claimed in claim 8 including the steps of sensing oscillations in said threshold extending feedback loop and controlling the feedback in said threshold extending feedback loop when said oscillations exceed a predetermined level.

10. An FM receiver system for receiving an FM signal having an FM carrier level and an FM noise threshold level, said system automatically exchanges increased signal distortion for a reduced FM noise threshold level, comprising:

detection means for detecting when noise peaks exceed the peak FM carrier level, conversion means for establishing the noise peak rate at which said noise peaks occur and providing a control voltage related thereto, a noise bandwidth determining filter coupled to said conversion means whose bandwidth can be switched to a specified narrower bandwidth by said control voltage, latching switch means for switching said filter to its narrower bandwidth condition when said noise peak rate exceeds a specified level and holds that condition until said noise peak rate falls below a specified level, at which point said latching switch means is unlatched thereby switching said filter to its former broader bandwidth condition.

11. An FM receiver system that automatically trades increased signal distortion for reduced FM noise threshold levels in an FM receiver for receiving an FM signal having an FM carrier, said FM receiver also including a threshold extending feedback loop, comprising:

detection means for determining the noise peak rate which is the rate at which noise peaks exceed the peak FM carrier, latched switch means coupled to said detection means having first and second switching states, said latched switch means being switched to said second switching state when said noise peak rate exceeds an upper level, and reverting to its first switching state when said noise peak rate falls below a lower level, a noise bandwidth determining filter coupled to said latched switch means, said filter being switched to a predetermined narrower bandwidth by said latched switch means in said second switching state, and to a broader bandwidth in said first switching state, an attenuator coupled in series with said threshold extending feedback loop, said attenutators attenuation being switched to a lower level by said latch switch means in said second switching state and being switched to a higher level in said first switching state.

12. The FM receiver system claimed in claim 11 having:

a voltage controlled attenuator coupled to said threshold extending feedback loop, means for detecting oscillations in said thresholding extending feedback loop which exceed a predetermined level and generating a control voltage related thereto, means for applying said control voltage to said voltage controlled attenuator increasing the attenuation of said attenuator thereby stabilizing the amplitude of the oscillations which exceed said predetermined level.

* * * * *